United States Patent
Cole et al.

(10) Patent No.: US 7,296,211 B2
(45) Date of Patent: Nov. 13, 2007

(54) SYSTEM AND METHOD FOR TRANSFERRING DATA ON A DATA LINK

(75) Inventors: Robert M. Cole, Endwell, NY (US); James E. Bishop, Newark Valley, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 752 days.

(21) Appl. No.: 10/348,659

(22) Filed: Jan. 22, 2003

(65) Prior Publication Data

US 2003/0237041 A1 Dec. 25, 2003

Related U.S. Application Data

(60) Provisional application No. 60/391,340, filed on Jun. 25, 2002.

(51) Int. Cl.
*H03M 13/00* (2006.01)
(52) U.S. Cl. .................................................. 714/776
(58) Field of Classification Search ........ 714/752–753, 714/755, 798, 807, 776; 370/465; 375/259, 375/292
See application file for complete search history.

(56) References Cited

U.S. PATENT DOCUMENTS

| | | | |
|---|---|---|---|
| 4,486,739 A | | 12/1984 | Franaszek et al. |
| 5,396,239 A | | 3/1995 | McMahon et al. |
| 5,740,186 A | * | 4/1998 | Widmer ...................... 714/753 |
| 5,907,566 A | * | 5/1999 | Benson et al. .............. 714/798 |
| 5,999,571 A | | 12/1999 | Shin et al. |
| 6,052,390 A | | 4/2000 | Deliot et al. |
| 6,157,652 A | | 12/2000 | Henson et al. |
| 6,229,822 B1 | | 5/2001 | Chow et al. |
| 6,438,728 B1 | * | 8/2002 | Susnow ...................... 714/807 |
| 6,606,328 B1 | * | 8/2003 | Susnow ...................... 370/465 |
| 6,628,725 B1 | * | 9/2003 | Adam et al. ................. 375/259 |
| 6,886,126 B1 | * | 4/2005 | Grivna et al. ............... 714/752 |
| 6,892,336 B1 | * | 5/2005 | Giorgetta et al. ........... 714/704 |

(Continued)

FOREIGN PATENT DOCUMENTS

EP          1 033 843 A2      9/2000

OTHER PUBLICATIONS

Actel, Implementing an 8b/10b Encoder/Decoder for Gigabit Ethernet in the Actel SX FPGA Family, Oct. 1998, retrived Mar. 2006, www.google, p. 1-20.*

(Continued)

*Primary Examiner*—Shelly Chase
(74) *Attorney, Agent, or Firm*—Wolf, Greenfield & Sacks, P.C.

(57) ABSTRACT

A system and method are provided for transferring a packet across a data link. The packet may include a stream of data symbols which is delimited by one or more framing symbols. Corruptions of the framing symbol which result in valid data symbols may be mapped to invalid symbols. If it is desired to transfer one of the valid data symbols that has been mapped to an invalid symbol, the data symbol may be replaced with an unused symbol. At the receiving end, these unused symbols are replaced with the corresponding valid data symbols. The data stream of the packet may be encoded with forward error correction information to detect and correct errors in the data stream.

20 Claims, 7 Drawing Sheets

U.S. PATENT DOCUMENTS

2001/0038674 A1    11/2001    Trans
2002/0018475 A1    2/2002    Ofek et al.

OTHER PUBLICATIONS

Widmer et al. A DC-Balanced, Partitioned-Block, 8B/10B Transmission code, Sep. 1983, IBM J. Res. Develop. vol. 27, No. 5, p. 440-451.* http://grouper.ieee.org/groups/802/3/10G_study/public/july99/widmer_1_0799.pdf, Albert X. Widmer, "Error Correction with Fibre Channel Transmission Code," IEEE 802.3 High Speed Group Jul. 1999 Plenary week meeting, IBM paper dated Jul. 2, 1999.

http://grouper.ieee.org/groups/802/3/10G_study-email/msg00494.html, "Re: Issues concerning 10 GbE speed standards".

http://grouper.ieee.org/groups/802/3/10G_study/public/nov99/taborek_2_1199.pdf, "Multilevel Serial PMD Update," Rich Taborek, IEEE 802.3 HSSG—10 GbE.

Zeger, Kenneth et al., "Pseudo-Gray Coding," IEEE Transactions on Communications, New York, vol. 38, No. 12, Dec. 1, 1990, pp. 2147-2158.

Granstrom, Karin et al., "Unequal Error Protection Codes," Area Communication, Stockholm, Jun. 13-17, 1988, Proceedings of the European Conference on Electrotechnics, New York, IEEE, pp. 174-176.

H. Imai et al., "A New Multilevel Coding Method Using Error-Correcting Codes," IEEE Transactions on Information Theory, IEEE Inc., New York, vol. IT-23, No. 3, 1977, pp. 371-377.

\* cited by examiner

SYSTEM AND METHOD FOR TRANSFERRING DATA ON A DATA LINK

RELATED APPLICATIONS

This application claims the benefit under Title 35 U.S.C. § 119(e) of U.S. Provisional Application Ser. No. 60/391,340, filed Jun. 25, 2002, entitled "System and Method for Transferring Data on a Data Link" by Robert M. Cole and James E. Bishop, the contents of which are hereby incorporated by reference.

STATEMENT OF GOVERNMENT INTEREST

The Government of the United States of America has rights in this invention pursuant to contract no. NAS9-20000, awarded by the National Aeronautics and Space Administration (NASA).

FIELD OF THE INVENTION

The present invention relates to computer networks and, more particularly, to high speed data links for connecting nodes in a computer network.

BACKGROUND OF THE INVENTION

With the widespread use of computer networks, it is often necessary to transfer large quantities of data between computer systems at high speeds. Many networking specifications have been developed to provide high data transfer rates. Typically, such specifications include hardware and software specifications. The hardware specification typically describes the network at the physical level, including information about the physical link and its electrical characteristics, types of connectors that may be used, and electrical parameters for various data rates. The software specification usually describes a network protocol through which nodes in the network may communicate and may include information about frame formats, sequence management, flow control, and topologies. One such networking specification is Ethernet. Ethernet is widely used in Local Area Networks (LANs), but often cannot support data rates capable of meeting the demands of some computer networks, particularly those which require real-time data transfer.

Another networking specification is Fibre Channel. Although the lower layers of the Fibre Channel protocol allow for high data rates, the upper layers of the Fibre Channel protocol require talk back between a receiving node and a sending node for control purposes, such as acknowledging receipt of data, notification of bad packets, and delivery of "busy" messages when a receiver is not ready to receive data. This additional overhead increases network traffic and transfer times. Moreover, Fibre Channel specifies a maximum bit error rate (BER) of $1 \times 10^{-12}$. Such a BER may not be suitable for some applications which require orders of magnitude higher reliability.

SUMMARY OF THE INVENTION

According to one aspect of the invention, a method is provided for transferring on a data link a packet having a plurality of data symbols from a set of symbols and at least one framing symbol from the set of symbols, the set of symbols including a subset of valid symbols and a subset of invalid symbols, the method comprising mapping at least some possible corruptions of the at least one framing symbol that result in valid symbols from the subset of valid symbols to the subset of invalid symbols, and replacing, in the packet, at least some of the valid symbols mapped in to the subset of invalid symbols with unused symbols in the set of symbols.

According to another aspect of the invention, the method further comprises adding error correction information pertaining to the plurality of data symbols to the packet. According to another aspect of the invention, the method further comprises encoding the packet in a format suitable for transmission. According to another aspect of the invention, the method further comprises transferring the packet on the serial link. According to another aspect of the invention, the method further comprises indicating an error in the packet if the packet includes a symbol from the subset of invalid symbols. According to another aspect of the invention, the method further comprises determining if the error in the packet is in a data symbol or framing symbol based on the location of the error in the packet. According to another aspect of the invention, the method further comprises recovering the valid symbols mapped into the subset of invalid symbols by replacing at least some of the unused symbols in the packet with the valid symbols mapped into the subset of invalid symbols.

According to one aspect of the invention, a system is provided for transferring on a data link a packet having a plurality of data symbols from a set of symbols and at least one framing symbol from the set of symbols, the set of symbols including a subset of valid symbols and a subset of invalid symbols, the system comprising a mapper for mapping at least some possible corruptions of the at least one framing symbol that result in valid symbols from the subset of valid symbols to the subset of invalid symbols, and a first character translation unit for replacing, in the packet, at least some of the valid symbols mapped in to the subset of invalid symbols with unused symbols in the set of symbols. According to another aspect of the invention, the system further comprises a first forward error correction unit for adding error correction information pertaining to the plurality of data symbols to the packet. According to another aspect of the invention, the system further comprises an encoder for encoding the packet in a format suitable for transmission. According to another aspect of the invention, the system further comprises a transmitter for sending the packet on the serial link, and a receiver for receiving the packet from the serial link. According to another aspect of the invention, the system further comprises an error detection unit for indicating an error in the packet if the packet includes a symbol from the subset of invalid symbols.

According to one aspect of the invention, a system is provided wherein the error detection unit further comprises an error resolution unit for determining if the error in the packet is in a data symbol or framing symbol based on the location of the error in the packet. According to another aspect of the invention, the system further comprises a second character translation unit for recovering the valid symbols mapped into the subset of invalid symbols by replacing at least some of the unused symbols in the packet with the valid symbols mapped into the subset of invalid symbols.

DETAILED DESCRIPTION

Digital communications transmitted over communications media, for example, coaxial cabling, twisted pair cabling, or fiber optic media, are often encoded to facilitate clock recovery, error detection, and maintain DC balance in the cable. Encoding involves the conversion of the bit stream of the data signal to symbols having signal characteristics which facilitate reception. Such characteristics may include a limited maximum run length and a limited DC imbalance.

DC imbalance can be described as the ratio of logical ones to logical zeros in a particular symbol. The maximum run length is the maximum number of consecutive logical ones or logical zeros in a symbol. Controlling DC imbalance and maximum run length can be important because without DC balance, inter-symbol interference may result from a single-bit transition and cause a bit error. The error occurs because a single-bit transition, after a long string of no transitions, may not contain the energy necessary to change the stored charge through the entire cable.

Also, controlling run length and DC balance may be important for synchronization purposes. A receiver can lose synchronization with a transmitter if too many intervals elapse without a bit transition. This loss of synchronization generally happens because clock recovery at the receiver relies upon transitions between logical one and logical zero to detect the clock frequency.

Figure 1:
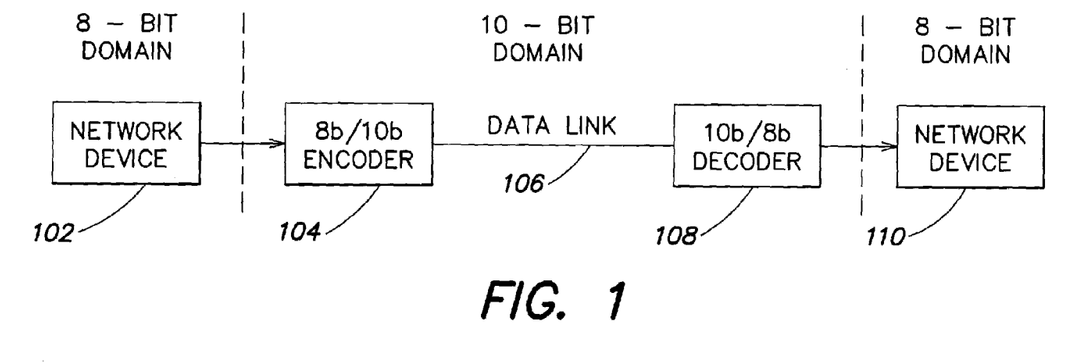
FIG. 1 is a block diagram of a data link using 8b/10b encoding according to one embodiment of the invention.

Nb/Mb encoding involves the encoding of each N-bit block of data into an M-bit symbol. For example, in 8b/10b encoding, 8-bit data blocks are encoded as 10-bit symbols at the transmitting end and the 10-bit symbols are transferred on the data link. At the receiving end, the 10-bit symbols are received and decoded into the original 8-bit data blocks. FIG. 1 illustrates a simple point-to-point network connection in which network device 102 and network device 110 are connected through data link 106. Network device 102 and network device 110 process information only in the 8-bit domain. Data is encoded into 10-bit symbols by 8b/10b encoder 104 and sent across the data link. Prior to reception of the data by network device 110, the 10-bit symbols are decoded by 10b/8b decoder 108. Encoder 104 and decoder 108 may, for example, be implemented as part of the transceivers which send the data. Thus, all data on the data link is in the 10-bit domain. The data link depicted in FIG. 1 is unidirectional. However, it should be understood that a bi-directional data link could also be used, wherein encoder 104 could also provide 10b/8b decoding and decoder 108 could additionally provide 8b/10b encoding. Moreover, FIG. 1 depicts a simple point-to-point network topology with two network devices. It should be understood that any number of network devices connected in any network topology, such as a star topology, ring topology, bus topology, or tree topology, could be used. Moreover, any type of network device, such as, for example, workstations, servers, routers, or switches could be used. Additionally, other Nb/Mb encoding schemes could be used. For examples, 7b/10b encoding could be used or 4b/5b encoding could be used.

Typically, in Nb/Mb encoding, not every M-bit symbol is be used. Some of the unused symbols may be designated as invalid symbols. Thus, transmission of an invalid symbol can be used to detect errors, such as corruption of valid symbols by noise. For example, in an 8b/10b encoding scheme, there are 256 possible different 8-bit data blocks. However, there are 1024 possible 10-bit symbols. For each possible 8-bit data block, there may be a positive disparity 10-bit symbol and a negative disparity 10-bit symbol which represent that block to help maintain DC balance on the transmission media. That is, if the running disparity on the cable is +1, then the transmitter may send a negative disparity version of the next symbol to bring the running disparity back down to 0. Even with two 10-bit symbols for each 8-bit data block, only 512 symbols out of 1024 possible symbols are used. However, the transmission protocol may require some control symbols which can be used for data framing or other control purposes. Still, it is likely that there will be some 10-bit symbols which are not used as either data symbols or control symbols. These symbols can be used as symbols that are invalid for transmission. Symbols in this set of invalid symbols are never intentionally transmitted. If any invalid symbol is received at the receiving end, it can be determined that a valid symbol (e.g., a data or control symbol) has been corrupted.

Although some errors may be detected by the receipt of invalid symbols, corruptions of valid symbols may sometimes result in other valid symbols. For example, in a system which uses 4-bit data symbols, suppose 0110 and 0111 are both valid data symbols and 1110 is an invalid symbol. Further, suppose the first bit of the symbol 0110 is corrupted from a logical '0' to a logical '1' during transmission. The resulting symbol, 1110, is an invalid symbol and will be detected as such at the receiving end. If, however, the last bit of the symbol 0110 is corrupted from a logical '0' to a logical '1' during transmission the result is a valid symbol (i.e., 0111) and will be perceived as such by the receiver, despite the fact that it is a corrupted symbol. As a result, it may also be necessary to provide a way to detect corruptions of valid symbol, which result in valid symbols. One way in which such errors can be detected is by monitoring the running disparity on the cable. By having positive-disparity and negative-disparity versions of each data block, DC balance on the cable can be maintained. As a result, if the running disparity of the cable exceeds a particular threshold, then it can be determined that an error occurred in transmission. Although receipt of invalid symbols and excessive running disparity allows for some error detection, it may be difficult or impossible to determine which symbol was intended for transmission and which bits in the symbol were corrupted. Further, the running disparity exceeding the predetermined threshold as a result of a corrupted symbol may not occur for a long period of time after the corrupted symbol was received.

To help correct such errors, a forward error correction (FEC) algorithm may be used. Forward error correction algorithms typically encode blocks of data so that any corruption of the block of data during transmission can be resolved at the receiving end. Examples of FEC algorithms which may be used in accordance with various embodiments of the invention include block code algorithms, cyclic code algorithms, Bose-Chaudhuri-Hocquenghem (BCH) algorithms, Viterbi coding algorithms, and convolutional code algorithms. Although applying FEC algorithms to a block of data may increase the size of the block of data (e.g., by adding error correction information), such algorithms provide a way to detect and correct errors upon reception.

An FEC algorithm may be applied to the data before Nb/Mb encoding, thus allowing valid M-bit symbols to be transmitted on the data link. At the receiving end, the symbols may first be decoded into N-bit blocks before using the FEC algorithm to detect and correct errors and recover the original N-bit blocks.

As mentioned above, many transmission protocols provide special control symbols which can be used for data framing or other control purposes. If such control symbols are used to frame the N-bit blocks of data, it may not be possible to apply an FEC algorithm to the control symbols because the FEC encoder requires use of the control symbols to define the data block to encode. As a result, the control symbols are not encoded with any forward error correction information. However, in some situations, it may be necessary to detect corruptions of the control symbols used for framing that occurred during transmission to achieve a desired BER. To provide error detection ability for these control symbols, possible corruptions of the control symbol used for framing that result in valid M-bit symbols may be mapped to the set of invalid symbols.

For example, some corruptions of the control symbol used for framing, which may be referred to herein as the framing symbol, may result in invalid M-bit symbols, while others result in valid data symbols or other valid control symbols. If corruption of the framing symbol results in an invalid symbol, then reception of invalid symbol at the receiving end will result in detection of an error. However, if corruption of the framing symbol results in a valid symbol, it is still desirable to detect a corruption of the framing symbol. Thus, valid symbols in which a corruption of the framing symbol may result can be mapped into the set of invalid symbols. As a result, when a framing symbol is corrupted into one of the valid symbols that has been mapped into the set of invalid symbols, the receiver can detect an error. However, an intentional transmission of one of the mapped valid symbols could also result in a detection of an error when one has not occurred. To prevent such situations, valid symbols which have been mapped into the set of invalid symbols may not be transmitted intentionally. If it is desired to transmit data which requires use of one of these symbols, a character translation unit may replace the symbol with an unused control symbol or an unused data symbol. Character translation will be discussed below in greater detail.

Figure 2:
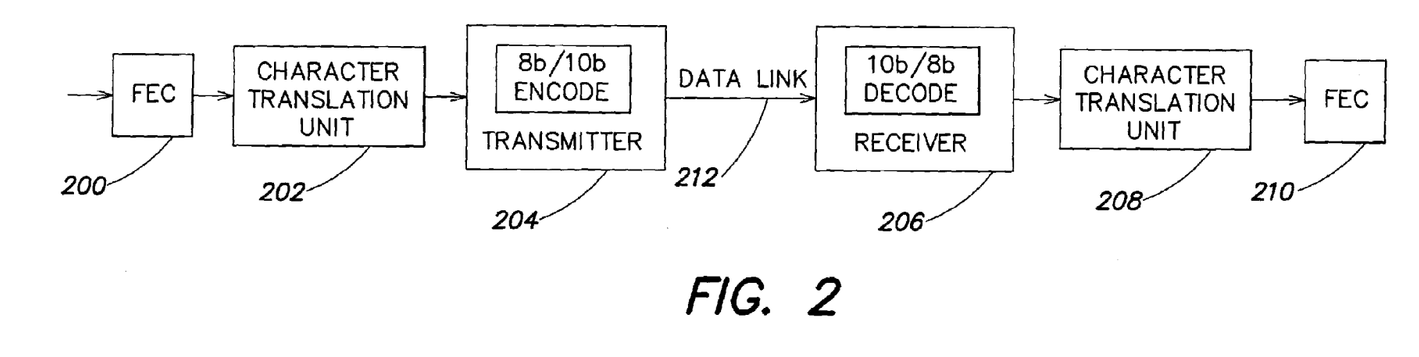
FIG. 2 is a block diagram of a computer system for transferring data over a data link according to one embodiment of the invention.

FIG. 2 illustrates an example of a transmission using a character translation unit. FEC encoder 200 receives data from the transmitting agent and applies an error correction algorithm to blocks of data defined by the framing symbol and passes the FEC encoded data to character translation unit 202. Character translation unit 202 determines if the FEC encoded data includes any symbols which have been mapped into the set of invalid symbols. If so, then these symbols are replaced with corresponding unused symbols and the data is passed to transmitter 204. If no mapped valid symbols are included in the data block then character translation unit 202 simply passes the data to transmitter 204. Transmitter 204 performs Nb/b encoding on the data and transmits the data on data link 212. At the receiving end, receiver 206 performs Mb/Nb decoding on the data and passes the data to character translation unit 208. Character translation unit 208 performs an opposite operation to that of character translation unit 202. That is, any unused symbols that were used to replace mapped valid symbols are replaced with the corresponding mapped valid symbols. Then, the data is passed to FEC decoder 210 which applies the FEC algorithm to decode the data and detect and correct errors in the data symbols. If all errors are corrected, the output of FEC decoder 210 is the original data that was passed to FEC encoder 200.

One embodiment of the invention will now be described with respect to a data link in a space shuttle. However, many other embodiments will readily occur to one skilled in the art and are intended to be within the spirit and scope of the invention. For example, embodiments of the invention could be used in situations in which a highly reliable and high speed data link is required. Such situations could include transfer of banking information, such as electronic checking or electronic transfer of funds information. Other applications in which the present invention could be used include computer networks, such as local area networks (LANs), Wide Area Networks (WANs) and Storage Area Networks (SANs). Moreover, in various embodiments of the invention, it is not required that a physical cable be used to transfer data. For example, various embodiments of the invention may be used with air as the transfer medium, such as in wireless networks. It should be appreciated that the invention is not limited to any particular application and various embodiments of the invention are suitable for use in any application in which it is desirable to transfer data in a reliable manner.

As the complexity of space shuttle missions increases, the processing demands on space shuttle general purpose computers (GPCs) have also increased. Because of the high reliability of the GPCs it is not desirable to replace or significantly modify them, but it is still necessary to increase their processing power. To increase the processing power of the GPCs, a command and display processor (CDP) may be added. The CDP is a second processing which offloads some of the processing demands of the GPCs. For example, the CDP may handle caution and warning processing and safety of flight processing. The CDP can receive information from an avionics ground equipment (AGE) port on the GPCs and can copy all memory transactions to its own memory to create and maintain an exact copy of the GPCs memory. An avionics ground equipment support (AGES) unit may interface with the AGE port on the GPC, serialize data received from the GPC and provide the information. The AGE port on the GPC is a unidirectional "listen only" test port. Because the AGE port is unidirectional, it is desirable that the data link between the GPC and CDP run in real-time and not rely on any re-transmission requests. Also, because weight restrictions exist on the shuttle, it is desirable that the data link be lightweight.

Figure 3:
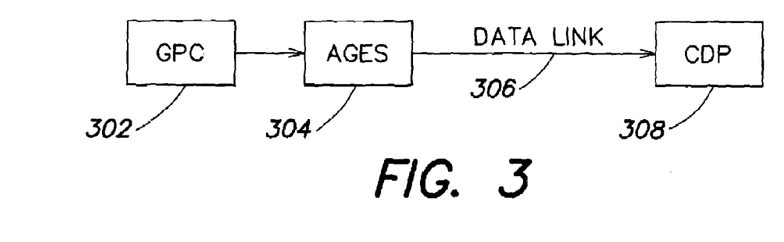
FIG. 3 is a block diagram of a computer system using a unidirectional serial data according to one embodiment of the invention.

FIG. 3 is a block diagram of a data link between the GPC and CDP according to one embodiment of the invention. In one embodiment of the invention, a serial data link 306 may be used to reduce weight. In a serial data link using differential signaling, two wires may be used. However, it is also possible to use a parallel data link having more than two wires. Moreover, although the present example is described in the context of unidirectional transmission, the invention is not limited in this respect. For example, various embodiments of the invention may be used with bi-directional data links. AGES unit 304 monitors the AGE test port of GPC 302 and serializes the data for transmission over serial data link 306. Data is transmitted on data link 306 to CDP 308.

Because of the desire for high speed data transfer rates, the Fibre Channel physical layer may be used to implement the serial data link. However, because the upper layers of the Fibre Channel employ data re-transmission in case of lost data and because the AGE port is a "listen only" port, it is not desirable to use the upper layers of the Fibre Channel transmission protocol. The Fibre Channel physical layer, FC-0, FC-1, and FC-2, specify the physical and electrical characteristics of the data link, the serial encoding and decoding of data, and basic signaling and data framing functions. Although the present example uses the physical layer of the Fibre Channel specification, many other network specifications could be used in other embodiments. For example, Ethernet or Gigabit Ethernet network specifications could be used.

Figures 4, 5:
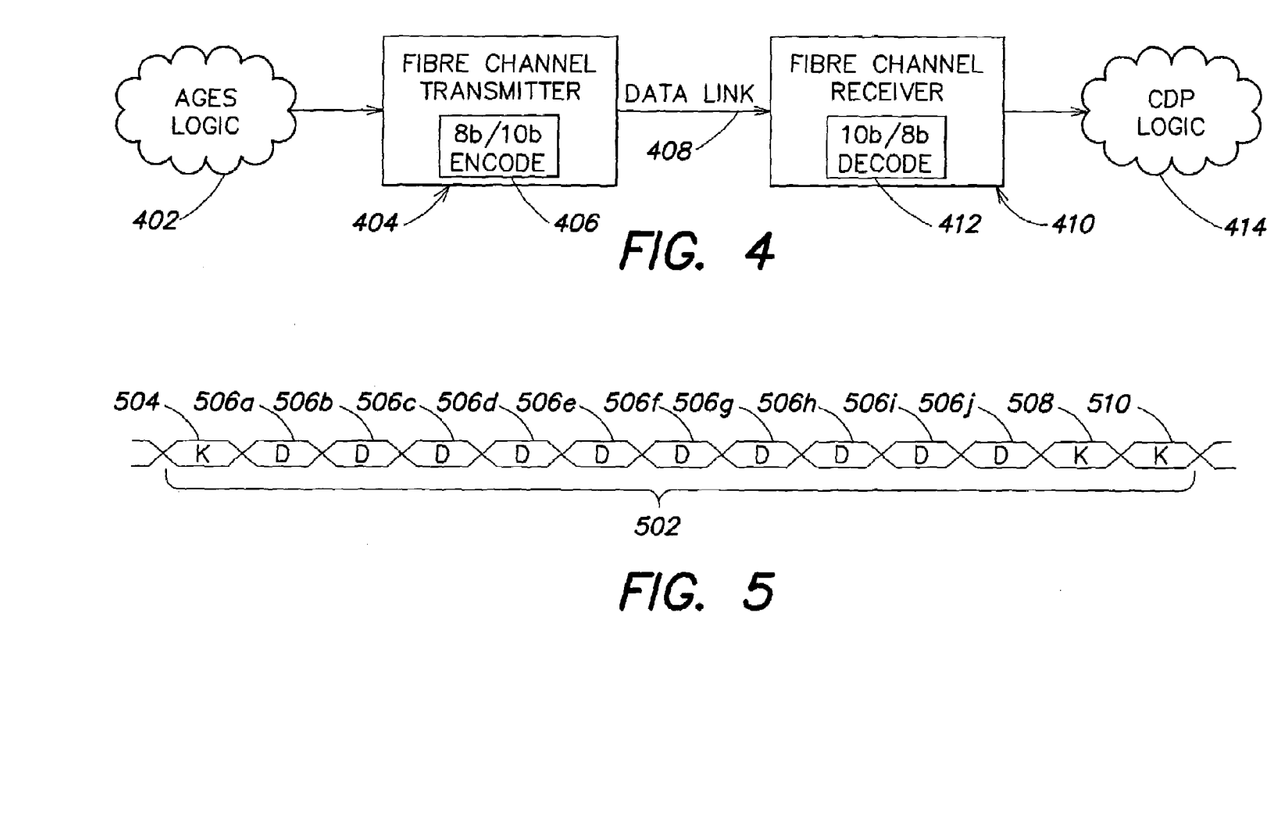
FIG. 4 if a block diagram of a computer system for transferring data over a data link according to one embodiment of the invention.
FIG. 5 is a diagram of an example of a transaction packet according to one embodiment of the invention.

As shown in FIG. 4, AGES logic 402 passes serialized data to Fibre Channel Transmitter 404. Fibre Channel transmitter performs 8b/10b encoding on the data using 8b/10b encoder 406 and transmits the data on data link 408. Fibre Channel receiver 410 receives data from data link, decodes the data with 10b/8b decoder 412, and passes the data to CDP 414, which may then deserialize the data.

Fibre Channel encodes data using 8b/10b encoding scheme. That is, 8-bit blocks of data are encoded as 10-bit symbols for transmission. However, because 1024 symbols are available (using all combinations of 10 bits) in the 10-bit domain, 512 symbols may be used such that each symbol has a positive disparity representation and a negative disparity representation to maintain DC balance on the data link and facilitate clock recovery at the receiving end. Of the 512 symbols, 256 are data symbols, 12 are control symbols, and 244 are invalid symbols. All valid symbols (e.g., the data symbols and control symbols) use either a 4/6, 5/5, or 6/4 ratio of ones to zeros. Invalid symbols are never intentionally transmitted. One control symbol, K28.5, is used for clock synchronization between the transmitter and receiver.

Although Fibre Channel specifics 8b/10b encoding, a 7b/10b encoding scheme could also be used. Because there are 138 5/5 10-bit symbols and only 128 possible 7-bit data characters, it is possible to use a 7b/10b encoding scheme where each 7-bit data character corresponds to a 5/5 10-bit symbol. In such a scheme, a 7-bit data character is first encoded as an 8-bit data character. Then, the usual 8b/10b encoding may occur. At the receiving end, a 10-bit symbol is decoded into its corresponding 8-bit data character. The 8-bit data character may then be decoded to the original 7-bit character. Also, ten 5/5 10-bit symbols may be used for control characters. If only the 5/5 data symbols and 5/5 control symbols are transferred on the data link, any single-bit corruption of any data symbol will result in either a 6/4 symbol or a 4/6 symbol. As a result, if a 6/4 symbol or a 4/6 symbol is received, an error can be detected. Likewise, if any symbol other than a 5/5 symbol is received, such as a 7/3 symbol or an 8/2 symbol, then an error can be detected in these symbols upon reception.

According to one embodiment of the invention, the maximum data rate of the data link may be one transaction every 250 nanoseconds. The speed of the serial link may be one symbol every 18.8 nanoseconds. As a result, a maximum of 13 symbols can be transmitted within the 250 nanosecond transaction time. FIG. 5 is a diagram which illustrates an example of a 13-symbol transaction packet 502. Transaction packet 502 includes three control symbols, 504, 508, and 510. The control symbols may be K28.5 framing symbols used for data framing and facilitation of clock synchronization. Transaction packet 502 may also include ten data symbols, 506*a*-506*j*. Of the ten data symbols, two may be FEC redundancy symbols to allow for correction of any corruption of a single corrupted data symbol. The FEC redundancy symbols may be, for example, the last two data symbols in the transaction packet (e.g., 506*h* and 506*j*) or may be located elsewhere in the transaction packet.

One forward error correction algorithm that may be used is a Reed-Solomon-based algorithm. A Reed-Solomon encoder can take as input data streams which include k symbols of m bits each and output a data stream which includes n symbols of m bits each. Thus, n-k symbols, which include redundancy information, may be added to the original data stream by the Reed-Solomon decoder. Based on this data stream, the Reed-Solomon decoder can correct (n-k)/2 symbols in the received data stream. In one embodiment of the invention, a Reed-Solomon encoder is used to encode data streams to create transaction packets of thirteen symbols. As mentioned above, before the transaction packet is 8b/10b encoded, it includes ten eight-bit data symbols and three eight-bit K28.5 framing symbols. There are 256 possible eight-bit characters. However, the Fibre Channel specification requires 256 data characters and 12 control characters. To represent each of these 256 data characters and 12 control characters in the eight-bit domain using only 256 eight-bit characters, eight-bit symbols may be used. An eight-bit symbol includes an eight-bit character plus an additional 3-bit qualifier which indicates whether the eight-bit character is a data character or a control character.

Figure 9:
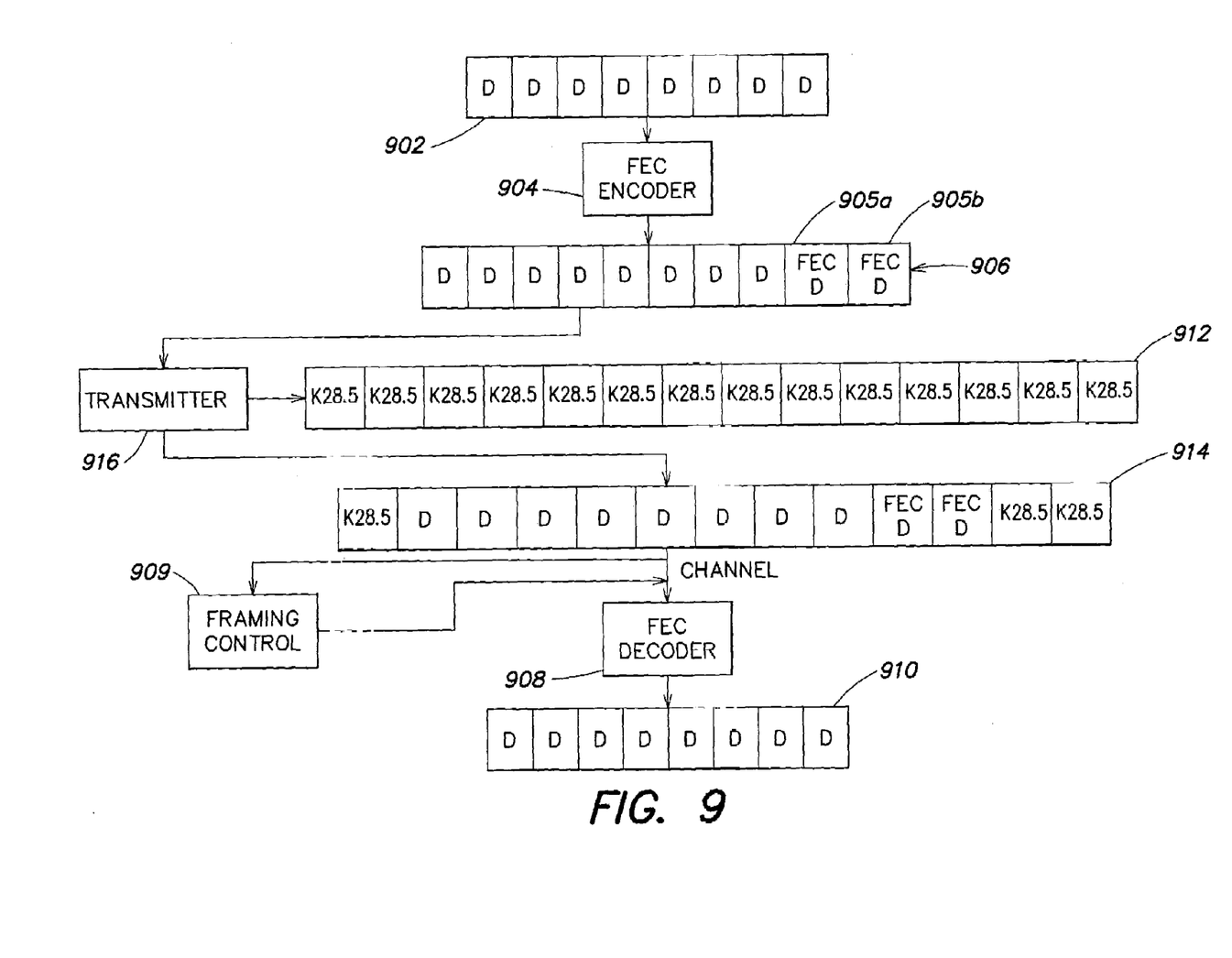
FIG. 9 is a block diagram illustrating an example of adding forward error correction information to a transaction packet, according to one embodiment of the invention.

FIG. 9 is a block diagram illustrating an example of adding forward error correction information to a transaction packet, according to one embodiment of the invention. A transaction packet 902 includes a data stream made up of data symbols. Transaction packet 902, which initially includes eight eight-bit data symbols, is passed to the Reed-Solomon encoder 904. Reed-Solomon encoder 904 adds two eight-bit data symbols 905*a* and 905*b* to the transaction packet, resulting in transaction packet 906. These two symbols, 905*a* and 905*b*, may include redundancy information which is used at the receiving end to detect and correct errors that occurred during transmission. As a result, transaction packet 906 will include the eight original data symbols, and two FEC symbols. Thus, as mentioned above, n-k/2 symbols, or any one symbol, in transaction packet 906, may be corrected. Transmitter 916 transmits a stream of K28.5 control symbols 912. When transmitter 916 receives a transaction packet, such as transaction packet 912, it imposes the transaction packet on the stream of K28.5 control symbols. As a result, the transaction packet is delimited by K28.5 control symbols. Transaction packet 914 is formed by transmitter 916 and is transmitted across the channel.

Figure 6A:
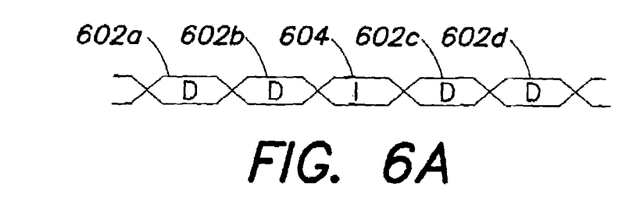
FIGS. 6A-6D are diagrams of transaction packets having invalid symbols according to one embodiment of the invention.
Figure 6B:
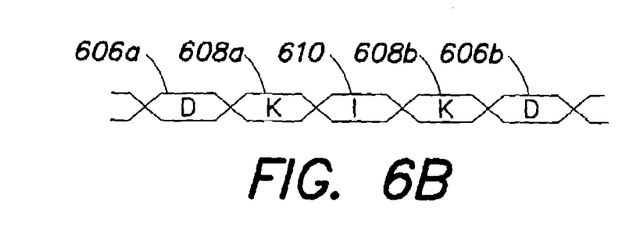
Figure 6C:
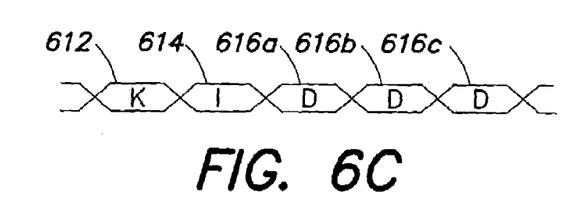
Figure 6D:
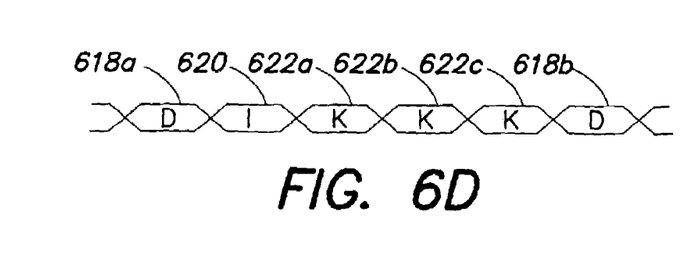

Framing control block 909 receives the transaction packet and determines whether the transaction packet includes any invalid symbols. If so, framing control block 909 determines if the invalid symbols are data symbols or control symbols. If, as shown in FIG. 6A, the invalid symbol 604 is received between two data symbols in the transaction packet (i.e., if the preceding and following symbols to the invalid symbol are data symbols), it may be inferred that the invalid symbol is a corrupted data symbol. The transaction packet may then be passed to the Reed-Solomon decoder 908 which may detect and correct the invalid data symbol. If, as shown in FIG. 6B, an invalid symbol 610 is received between two control symbols (e.g., 608a and 608b), it may be inferred that the invalid symbol is a K28.5 symbol and, as a result, framing may be preserved. If, as illustrated in FIG. 6C, an invalid symbol 614 is received at the start of the data stream, and the following nine symbols are data symbols, and the tenth subsequent symbol is a K28.5 symbol, then the invalid symbol may inferred to be a data symbol. The transaction packet may then be passed to the Reed-Solomon decoder for error detection and correction. If, however, the following ten symbols are data symbols, then the invalid symbol may be inferred to be a K28.5 symbol and framing is preserved. If, as shown in FIG. 6D, an invalid symbol 620 is received at the end of the data stream, then the invalid character is inferred to be a data symbol because the previous nine symbols were data symbols. The transaction packet may then be passed to the Reed-Solomon decoder which can detect and correct the bad symbol.

In one embodiment of the invention, the Reed-Solomon encoder/decoder may be implemented so that any single symbol corruption in a transaction packet and some two-symbol corruptions in a transaction packet may be corrected. As described above, by including two Reed-Solomon redundancy symbols in a 10-symbol data stream, any one symbol in the data stream may be corrected. Each symbol includes an eight-bit data character. To correct errors in the data stream, each eight-bit data character may be divided into two four-bit data characters. Thus, for each eight-bit data character, there is an upper four-bit data character, including the upper four bits, and a lower four-bit data character, including the lower four bits. These four-bit data characters may treated as the symbols for two four-bit wide Reed-Solomon encoders/decoders operating in parallel. A first of the four-bit wide Reed-Solomon encoders/decoders may operate on all of the upper four-bit symbols of the data stream, while the second Reed-Solomon encoder/decoder operates on all of the lower four-bit symbols. Because any corruption of a single eight-bit symbol can be corrected using a single Reed-Solomon decoder, any corruption of any single four-bit symbol can be corrected.

Further, it also possible to correct some errors in two different eight-bit characters. For example, suppose that the upper four-bit symbol of a first eight-bit data character of the data stream is corrupted. This error can be corrected by the first Reed-Solomon decoder, as long as no other upper four-bit symbols in any of the other eight-bit data characters in the data stream are corrupted. Now, suppose that a lower four-bit symbol from a second eight-bit data character of the same data stream is corrupted. The second Reed-Solomon decoder which is processing the lower four-bit symbols may correct this symbol as long as no other four-bit symbols in any of the other eight-bit data characters are corrupted. As a result, any single corrupted eight-bit data character may be corrected and some corruptions of two eight-bit data characters may be corrected, provided that the corruptions occur in opposite halves of the eight-bit data characters.

Figure 10:
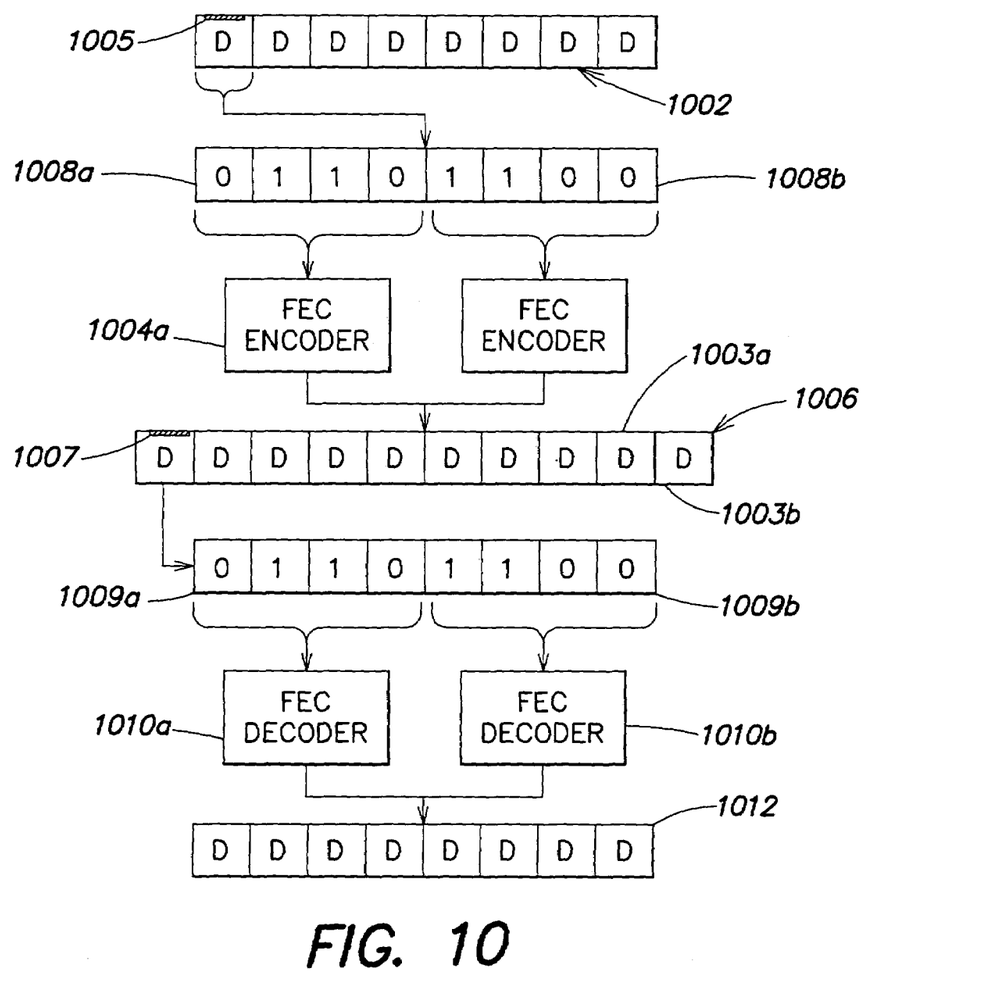
FIG. 10 is a block diagram illustrating an example of forward error correction with multiple FEC decoders, according to one embodiment of the invention.

FIG. 10 is a block diagram illustrating an example of forward error correction with multiple FEC decoders according to one embodiment of the invention. Transaction packet 1002 includes a data stream having eight eight-bit data symbols. FEC encoders 1004a and 1004b each operate on different portions of each data symbol in transaction packet 1002. FEC encoders 1004a and 1004b add two error correction symbols to generate transaction packet 1006. On the decoding end, a data symbol in transaction packet 1006, such as symbol 1007, may be divided in to an upper half 1009a, and a lower half 1009b. FEC decoder 1010a can process and perform error correction on all upper halves of the data symbols in transaction packet 1006. Likewise FEC decoder 1010b can process and perform error correction on all the lower halves of the data symbols in transaction packet 1006 using the FEC symbols. As a result, corrected transaction packet 1012 may be produced.

Although the above-described example uses two FEC encoders/decoders operating on four-bit portions of an eight-bit character many other variations are possible. For example, four Reed-Solomon encoders/decoders could be used, with each encoder/decoder processing a two-bit portion of an eight-bit data character. Likewise, eight Reed-Solomon encoders/decoders could be used, with each encoder/decoder working on a one-bit portion of an eight-bit data character. Moreover, it should be appreciated that the above-described technique of using multiple FEC decoders on portions of a single character is not limited to eight-bit characters. Any size character could be used. Moreover, any number of FEC encoders/decoders could be used and the character to decoded may be split up into any number or size portions. For example, 16-bit characters could be divided into two eight-bit portions, using two FEC encoders/decoders. Similarly, 16-bit characters could be divided into four four-bit portions using four FEC encoders/decoders. Moreover, although the above described example uses data streams having eight data symbols and two FEC symbols, the invention is not limited in this respect. Any suitable number of data symbols may be included in the transaction packet. It should be appreciated that the number of FEC redundancy symbols may depend on the number of data symbols in the data stream and on the particular FEC algorithm being used. Furthermore, although the above-described example uses this technique in the context of Reed-Solomon forward error correction, the invention is not limited in this respect, as various embodiments of the invention could use the same technique with many other different forward error correction algorithms, such as BCH algorithms.

It should be appreciated that while the above described system and method for forward error correction is used in a data link, the invention is not limited in this respect. Indeed, various embodiments of the invention may be used in many other applications. For example, embodiments of the FEC technique described above may be used in many digital signal processing applications, such as playback of compact discs or other digital audio, digital wireless communications, such as cellular phones or wireless computer networks.

Because there are two versions of the 10-bit K28.5 symbol, a positive disparity version and a negative disparity version, there are 20 possible single-bit corruptions of the K28.5 symbol. It may not be possible to use forward error correction, such as the Reed-Solomon algorithm described above, on the K28.5 symbols because this symbol is used by the forward error correction decoder (e.g., the Reed-Solomon decoder) to define the data stream for decoding. Of these 20 possible single-bit corruptions of the K28.5 eight result in an invalid transmission symbol, eight result in a valid data symbol, and four result in a valid control symbol. The four single-bit corruptions of the K28.5 symbol that result in a control symbol result in two different control symbols. That is, one of these four single-bit corruptions of the K28.5 symbol results in the positive disparity version of a first control symbol, a second of these four single-bit corruptions of the K28.5 symbol results in the negative disparity version of the first control symbol. Likewise, a third of these four single-bit corruptions results in a positive disparity version of a second control symbol and a fourth of these four single-bit corruptions results in the negative disparity version of the second control symbol. These two control symbols are mapped into the set of invalid symbols. That is, they are never intentionally transmitted and are treated as an invalid symbols at the receiving end. As a result, of the original twelve control symbols, nine are left unused.

To prevent a corrupted K28.5 symbol from being interpreted as a valid symbol, the eight data symbols into which a K28.5 symbol can be corrupted are mapped into the set of invalid symbols. When it is desired to intentionally transmit one of these eight data symbols, the data symbols can be replaced with one of the unused control symbols. That is, each of the eight valid data symbols into which a K28.5 symbol can be corrupted may be assigned a corresponding control symbol from the set of unused control symbols. When it is desired to transmit one of these eight data symbols, it is replaced with its corresponding control symbol. As a result, any single-bit corruption of the K28.5 symbol will result in an invalid symbol.

At the receiving end, if one of the nine unused control symbols is received in a transaction packet, it may be replaced with its corresponding data symbol. Then, Reed-Solomon decoding may be performed on the transaction packet to detect and correct any errors in data symbols.

Figure 7:
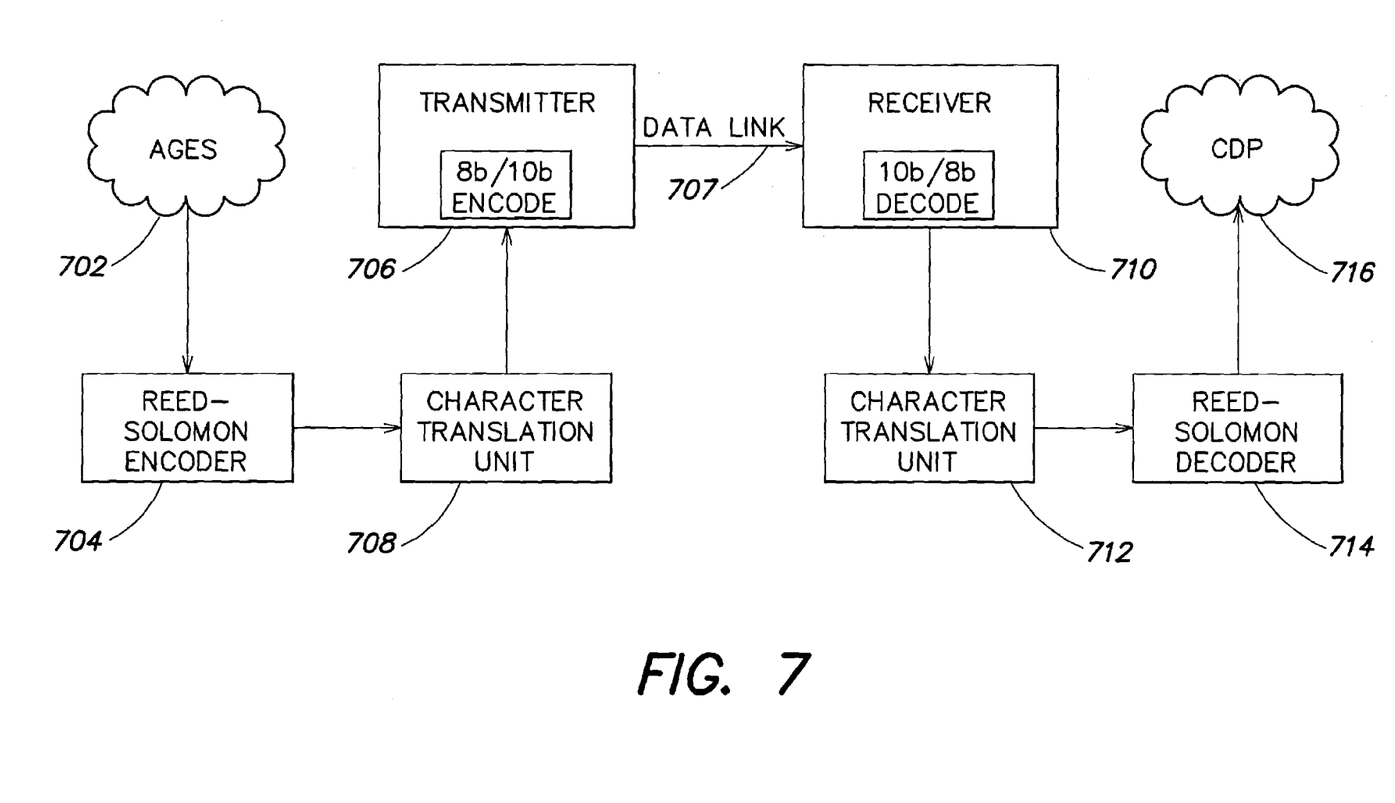
FIG. 7 is a block diagram of computer system using forward error correction and character translation for data transfer according to one embodiment of the invention.
Figure 8:
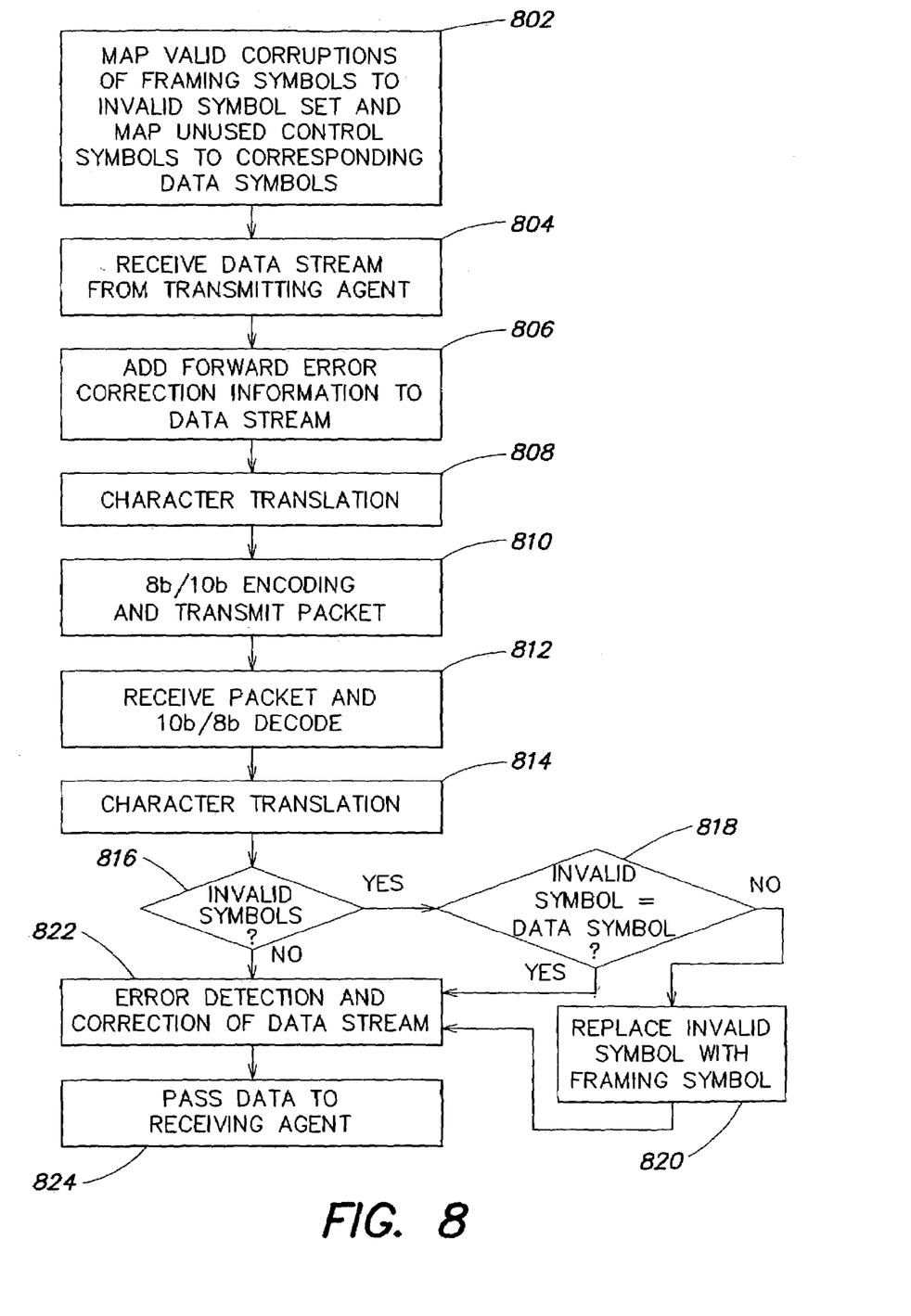
FIG. 8 is a flowchart illustrating an example of a method for transferring data using the computer system of FIG. 7.

FIG. 7 is a block diagram illustrating an example of a computer system which may be used in accordance with one embodiment of the invention. FIG. 8 is a flow chart illustrating an example of a method for transfer of data using the system of FIG. 7. At step 802, any corruptions of the framing symbol (e.g., K28.5 symbol) that result in a valid data symbol are mapped to the set of invalid symbols and unused control symbols are mapped to the valid data symbols that were mapped into the set of invalid symbols. It should be understood that this step need not be performed every time data is to be transferred. Indeed, this step may be performed only one time. Once the mapping is established, modules such as character translation unit 712, receiver 710, or CDP 716 (FIG. 7) can be programmed to acknowledge these mappings. Thus, any future use of these modules may take the mappings into account. At step 804, data is received from the transmitting agent. The transmitting agent may be, for example, AGES 702. At step 806, forward error correction information is added to the data stream. Forward error correction information may be added, for example, by Reed-Solomon encoder 704.

Next, at step 808 character translation is performed. Character translation involves replacing any valid data symbols that were mapped into the set of invalid symbols with corresponding unused symbols, such as control symbols. Reed-Solomon encoder 704 and character translation unit 708 may be implemented, for example, in an application specific integrated circuit (ASIC) or a programmable logic device (PLD), such as a field programmable gate array (FPGA). Moreover, Reed-Solomon encoder 704 and character translation unit 708 may be implemented on the same ASIC or PLD or on separate ASICs or PLDs. Further, Reed-Solomon encoder 704 and character translation unit 708 may be implemented as part of AGES unit 702 or may be implemented as separate units. Character translation unit 708 may output a transaction packet which, at step 810, is encoded using, for example, 8b/10 b encoding, and transmitted over data link 707. Transmitter 706 may be, for example, a commercially available Fibre Channel transmitter. At step 812, the transaction packet is received by receiver 710 and 10b/8b decoding is performed on the transaction packet. Receiver 710 may be a commercially available Fibre Channel receiver.

At step 814, character translation unit 712 may replace any of the unused control symbols which were inserted into the packet by character translation unit 708 with the corresponding data symbols which were originally in the data stream. At step 816, it may be determined if the transaction packet includes any invalid symbols. This function may be performed by character translation unit 712 or may be performed by a separate logic device, such as a PLD or ASIC. If the transaction packet includes no invalid symbols, then it may be passed to Reed-Solomon decoder 714. If the transaction packet includes an invalid symbol, then it may be determined at step 818 if the invalid symbol is a control symbol (e.g., K28.5 symbol) or a data symbol. If it is a data symbol, then the packet may be passed to Reed-Solomon decoder 714. If the invalid symbol is a control symbol, then the invalid symbol may simply be replaced with the proper control symbol (step 820).

At step 822, Reed-Solomon decoder 714 performs error detection and correction on the data stream. Similar to Reed-Solomon encoder 704 and character translation unit 708, Reed-Solomon decoder 714 and character translation unit 712 may be implemented as a single ASIC or PLD or separate ASICs or PLDs. Further, character translation unit 712 and Reed-Solomon decoder 714 may be implemented as part of CDP 716 are may be implemented as a separate unit. Finally, the data stream is passed to receiving agent 824 (e.g. CDP 716).

Having thus described various embodiments of the present invention, additional alterations, modifications, and improvements will readily occur to those skilled in the art. Accordingly, the foregoing description is by way of example only, and not intended to be limiting. The invention is limited only as defined by the following claims and the equivalents thereto.

What is claimed is:

1. A method of transferring on a data link a packet having a plurality of data symbols from a set of symbols and at least one framing symbol from the set of symbols, the set of symbols including a subset of valid symbols and a subset of invalid symbols, the method comprising:
   mapping at least some possible corruptions of the at least one framing symbol, that result in valid symbols, from the subset of valid symbols to the subset of invalid symbols; and
   replacing, in the packet, at least some of the valid symbols mapped in to the subset of invalid symbols, with unused symbols in the set of symbols.

2. The method of claim 1, further comprising:
   adding error correction information pertaining to the plurality of data symbols to the packet.

3. The method of claim 2, further comprising:
   encoding the packet in a format suitable for transmission.

4. The method of claim 3, wherein encoding the packet in a format suitable for transmission further comprises performing 8b/10b encoding on the packet.

5. The method of claim 3, wherein encoding the packet in a format suitable for transmission further comprises performing 7b/10b encoding on the packet.

6. The method of claim 2, further comprising:
   transferring the packet on the serial link.

7. The method of claim 6, further comprising:
   indicating an error in the packet if the packet includes a symbol from the subset of invalid symbols.

8. The method of claim 7, further comprising:
determining if the error in the packet is in a data symbol or framing symbol based on the location of the error in the packet.

9. The method of claim 6, further comprising:
recovering the valid symbols mapped into the subset of invalid symbols by replacing at least some of the unused symbols in the packet with the valid symbols mapped into the subset of invalid symbols.

10. The method of claim 9, further comprising:
applying an error correction algorithm to the packet to correct errors in the plurality of data symbols based on the error correction information.

11. A system for transferring on a data link a packet having a plurality of data symbols from a set of symbols and at least one framing symbol from the set of symbols, the set of symbols including a subset of valid symbols and a subset of invalid symbols, the system comprising:
a mapper for mapping at least some possible corruptions of the at least one framing symbol that result in valid symbols, from the subset of valid symbols to the subset of invalid symbols; and
a first character translation unit for replacing, in the packet, at least some of the valid symbols mapped in to the subset of invalid symbols, with unused symbols in the set of symbols.

12. The system of claim 11, further comprising:
a first forward error correction unit for adding error correction information pertaining to the plurality of data symbols to the packet.

13. The system of claim 12, further comprising:
an encoder for encoding the packet in a format suitable for transmission.

14. The system of claim 13, wherein the encoder performs 8b/10b encoding on the packet.

15. The system of claim 13, wherein the encoder performs 7b/10b encoding on the packet.

16. The system of claim 12, further comprising:
a transmitter for sending the packet on the serial link; and
a receiver for receiving the packet from the serial link.

17. The system of claim 16, further comprising:
an error detection unit for indicating an error in the packet if the packet includes a symbol from the subset of invalid symbols.

18. The system of claim 17, wherein the error detection unit further comprises an error resolution unit for determining if the error in the packet is in a data symbol or framing symbol based on the location of the error in the packet.

19. The system of claim 16, further comprising:
a second character translation unit for recovering the valid symbols mapped into the subset of invalid symbols by replacing at least some of the unused symbols in the packet with the valid symbols mapped into the subset of invalid symbols.

20. The system of claim 19, further comprising:
a second forward error correction unit for correcting errors in the plurality of data symbols based on the error correction information.

* * * * *